(12) United States Patent
Meyer et al.

(10) Patent No.: US 6,201,180 B1
(45) Date of Patent: Mar. 13, 2001

(54) INTEGRATED PHOTOVOLTAIC SYSTEM

(75) Inventors: John F. Meyer, Eagle; David G. Porter, East Troy; Daniel H. Zietlow, Milwaukee; Dale R. Stefanac; Roger H. Troyer, both of East Troy, all of WI (US)

(73) Assignee: Omnion Power Engineering Corp., East Troy, WI (US)

( * ) Notice: Subject to any disclaimer, the term of this patent is extended or adjusted under 35 U.S.C. 154(b) by 0 days.

(21) Appl. No.: 09/293,400

(22) Filed: Apr. 16, 1999

(51) Int. Cl.[7] .......................... H01L 31/05; H01L 31/042
(52) U.S. Cl. .......................... 136/244; 52/173.3; 126/623
(58) Field of Search .................................. 136/244, 245, 136/246; 52/173.3; 126/621, 622, 623

(56) References Cited

U.S. PATENT DOCUMENTS

| | | | |
|---|---|---|---|
| 4,217,633 | 8/1980 | Evans, Jr. | 363/27 |
| 4,233,085 | 11/1980 | Roderick et al. | 136/244 |
| 4,283,106 | 8/1981 | Bunnell | 339/125 |
| 4,375,662 * | 3/1983 | Baker | 363/95 |
| 4,636,931 * | 1/1987 | Takahashi et al. | 363/71 |
| 4,680,690 | 7/1987 | Dickerson | 363/43 |
| 4,980,574 | 12/1990 | Cirrito | 307/21 |
| 5,092,939 * | 3/1992 | Nath et al. | 136/251 |
| 5,125,608 * | 6/1992 | McMaster et al. | 248/163.1 |
| 5,232,518 | 8/1993 | Nath et al. | 136/251 |
| 5,289,999 | 3/1994 | Naujeck et al. | 244/173 |
| 5,406,936 * | 4/1995 | Hirai et al. | 126/623 |
| 5,409,549 * | 4/1995 | Mori | 136/244 |
| 5,571,338 * | 11/1996 | Kadonome et al. | 136/251 |
| 5,589,006 * | 12/1996 | Itoyama et al. | 136/248 |
| 5,592,074 * | 1/1997 | Takehara | 363/131 |
| 5,677,833 | 10/1997 | Bingley | 363/71 |
| 5,701,067 * | 12/1997 | Kaji et al. | 320/2 |
| 5,747,967 * | 5/1998 | Muljaldi et al. | 326/39 |
| 5,927,026 * | 7/1999 | Durham | 52/173.3 |

* cited by examiner

*Primary Examiner*—Ellis Robinson
*Assistant Examiner*—Michael C. Miggins
(74) *Attorney, Agent, or Firm*—Andrus, Sceales, Starke & Sawall

(57) ABSTRACT

An integrated photovoltaic system includes a plurality of individual photovoltaic modules that each convert solar energy into DC power. Each of the photovoltaic modules is coupled to a busway that combines the DC power generated by each photovoltaic module into a DC power output. The connection between each photovoltaic module and the busway is environmentally sealed, as is the electrical wiring contained within the busway. The busway is coupled to a DC to AC power inverter that provides a supply of AC power. The coupling between the busway and the power inverter is environmentally protected, such that the entire DC wiring for the photovoltaic system is environmentally sealed and the system functions as an "AC photovoltaic system" having an AC power output.

27 Claims, 10 Drawing Sheets

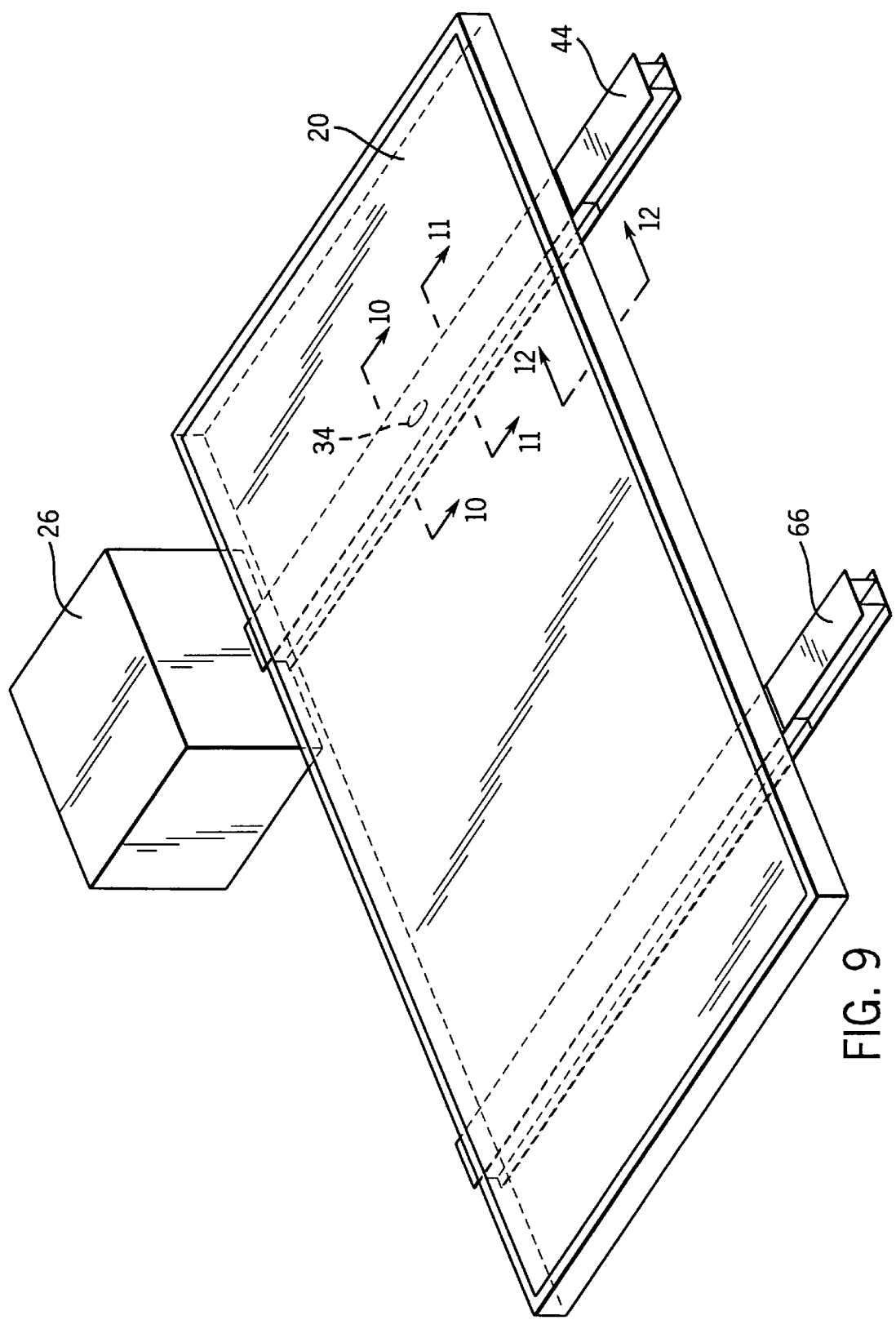

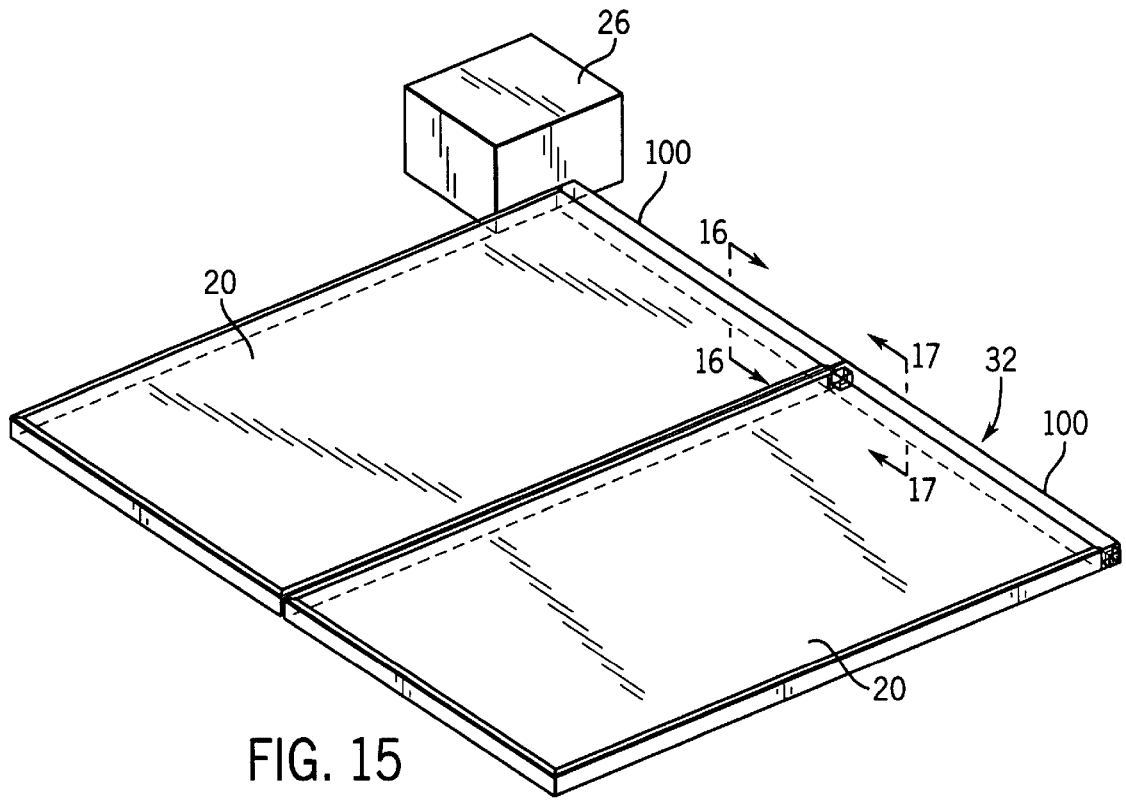
FIG. 15
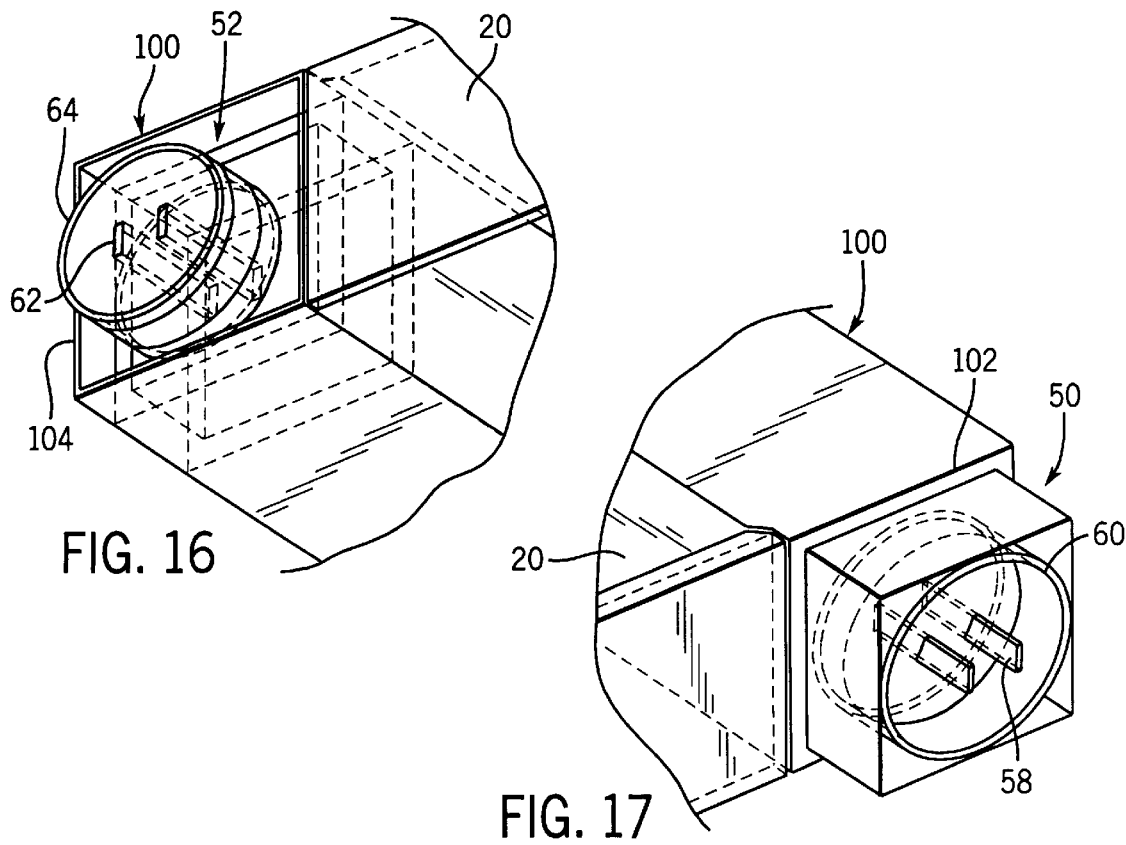
FIG. 16
FIG. 17

INTEGRATED PHOTOVOLTAIC SYSTEM

BACKGROUND OF THE INVENTION

The present invention generally relates to a photovoltaic energy system. More specifically, the present invention relates to a photovoltaic energy system that includes a plurality of photovoltaic modules coupled to a power inverter by environmentally protected wiring within a busway such that the photovoltaic system outputs AC power.

Conventional photovoltaic power systems for use in residential and small commercial applications typically include a plurality of interconnected photovoltaic modules mounted on the roof of the residential or commercial building. The interconnected modules are often referred to an array. Each of the photovoltaic modules includes numerous photovoltaic cells that convert solar energy into DC power. Typically, the DC power generated by each of the modules is combined by conventional external wiring and fed to a remote DC to AC power inverter, such as the Series 2400 produced by Omnion Power Engineering Corporation, East Troy, Wis., assignees of the present application. In this type of photovoltaic system, the external wiring carrying the DC power runs from the photovoltaic modules on the roof of the building down to the power inverter, which is mounted either internally or externally to a wall of the building. In most photovoltaic power systems, the power inverter is positioned near the electrical power input to the building from a utility provider, since the AC power output of the power inverter is fed into the distribution panel for the building along with the utility power supply.

Although this type of photovoltaic power system has proved to be an effective way to supplement the electrical energy supplied by the utility provider, the external DC wiring running between the individual photovoltaic modules and from the roof of the building down to the power inverter presents problems during installation of the photovoltaic power system. Since DC wiring is seldom installed in building projects other than photovoltaic systems, electricians more familiar with AC wiring codes and requirements often have difficulty in knowing how to comply with all of the specific building code requirements that accompany the proper installation of DC wiring. Thus, the installation of a photovoltaic power systems having external DC wiring requires the electrician installing the system to expend a significant amount of time reviewing seldom used building code requirements for DC wiring, which increases the cost and time of the installation process.

In addition to the problems caused by the DC wiring during the installation process, the National Electric Code, which is adopted by most local governments, imposes additional requirements on photovoltaic power systems that include external DC wiring running from the photovoltaic modules to the power inverter. The more stringent requirements for external DC wiring mandated by the National Electric Code result in higher system cost due to the additional components and safety devices that must be included in the photovoltaic power system.

One way to alleviate the above-identified installation problems and to avoid the code requirements imposed on photovoltaic systems having external DC wiring is to incorporate a DC to AC power inverter directly into each individual photovoltaic panel. In such a system, such as the Sunsine™ 300 manufactured by Ascension Technology, Inc., Waltham, Mass., the DC power generated by each individual photovoltaic panel is converted into AC power within the panel itself, such that an electrician installing the panel does not have to deal with external DC wiring. Although this type of "AC photovoltaic module" functions well and avoids many of the above-identified problems, incorporating a DC to AC power inverter into each individual photovoltaic panel greatly increases the cost of the individual panels as compared to conventional photovoltaic panels that output DC power.

It is therefore an object of the present invention to provide a photovoltaic energy system that combines a plurality of individual photovoltaic modules and a single DC to AC power inverter into an environmentally protected assembly that outputs a supply of AC power. It is a further object of the invention to provide a photovoltaic system that incorporates a busway that interconnects the plurality of individual photovoltaic modules and the power inverter in an environmentally protected manner. It still a further object of the invention to provide a photovoltaic module in which the busway and the individual photovoltaic modules include mating plug members and receptacles that allow the individual modules to be connected to the busway in an environmentally sealed manner. It is still a further object of the invention to provide an DC to AC power inverter that is removably connected to the busway and environmentally protected when attached to the busway, such that the entire DC wiring for the photovoltaic system is concealed and protected.

In yet another object of the invention, the busway includes multiple segments that are each attached to or incorporated within the frame member defining each individual photovoltaic module. It is still a further object of the invention to provide a photovoltaic system in which the busway is formed from joined busway segments that each include an end plug and an end receptacle that allows the busway segments to be connected and environmentally sealed.

Various other features, objects and advantages of the invention will be made apparent from the following description taken together with the drawings.

SUMMARY OF THE INVENTION

The present invention is designed to eliminate or overcome the problems inherent in the conventional photovoltaic power systems described above. In accordance with the invention, a photovoltaic system comprises a plurality of individual photovoltaic modules that each convert solar energy into DC power. The photovoltaic system includes environmentally protected electrical wiring that connects the plurality of photovoltaic modules and provides a DC power output. The electrical wiring and the individual connections between each photovoltaic module are environmentally protected such that the electrical wiring and the photovoltaic modules create a sealed photovoltaic energy system.

The environmentally protected electrical wiring that provides the DC power output is coupled to a DC to AC power inverter. The DC to AC power inverter converts the DC power output into AC power that can be utilized in conventional commercial and residential applications. In accordance with the invention, the connection between the power inverter and the electrical wiring providing the DC power output is environmentally protected, such that the combination of the photovoltaic modules, the electrical wiring, and the power inverter forms a single sealed unit in which all of the DC wiring is environmentally protected and a single AC power output is generated.

In accordance with the present invention, a busway is provided that includes the electrical wiring that joins each of the photovoltaic modules. In one embodiment of the invention, the busway includes a plurality of spaced sealed receptacles that receive corresponding sealed plug members formed on each of the photovoltaic modules. The combination of the sealed receptacles on the busway and the sealed plug members on the photovoltaic modules allow the photovoltaic modules to be coupled to the busway and be environmentally protected.

The busway of the invention can include either a single, continuous member extending the entire length of the photovoltaic array between the plurality of modules, or can include a plurality of individual busway segments. In an embodiment utilizing the busway segments, a single busway segment is associated with each of the photovoltaic modules such that each photovoltaic module is mounted to one of the busway segments. The busway segments are each joined to the busway segments positioned adjacent thereto by conventional means, such that the plurality of busway segments define the complete busway that is environmentally sealed. In the preferred embodiment of the invention, each busway segment includes a sealed end plug and a sealed receptacle formed on opposing ends that are received in the mating element formed on the adjacent busway segment.

In accordance with one embodiment of the invention, the busway interconnecting the series of photovoltaic panels can be a structural member such that the busway not only interconnects the modules but also forms at least a portion of the mounting structure for the plurality of photovoltaic modules.

An important advantage of the photovoltaic system of the invention is that the power output from the system is AC. Thus, conventional AC wiring, which is more commonly used than DC wiring, runs from the photovoltaic system of the invention to the residential or commercial power distribution panel for the building. The entire DC wiring for the photovoltaic system of the invention is sealed and environmentally protected, which makes field installation much faster and easier than prior photovoltaic systems.

BRIEF DESCRIPTION OF THE DRAWINGS

The drawings illustrate the best mode presently contemplated of carrying out the invention.

In the drawings:

FIG. 9 is an enlarged perspective view of a portion of the photovoltaic system shown in FIG. 3, illustrating a single photovoltaic module, a single busway segment and a single structural support segment;

FIG. 15 is a perspective view illustrating an alternate embodiment of the photovoltaic system of the present invention incorporating the busway into each of the photovoltaic modules;

FIG. 16 is an enlarged partial perspective view taken along line 16—16 of FIG. 15 illustrating a receptacle formed in the photovoltaic module;

FIG. 17 is an enlarged partial perspective view taken along line 17—17 of FIG. 15 illustrating an end plug formed on one end of the photovoltaic module;

DETAILED DESCRIPTION OF THE INVENTION

Figure 1:
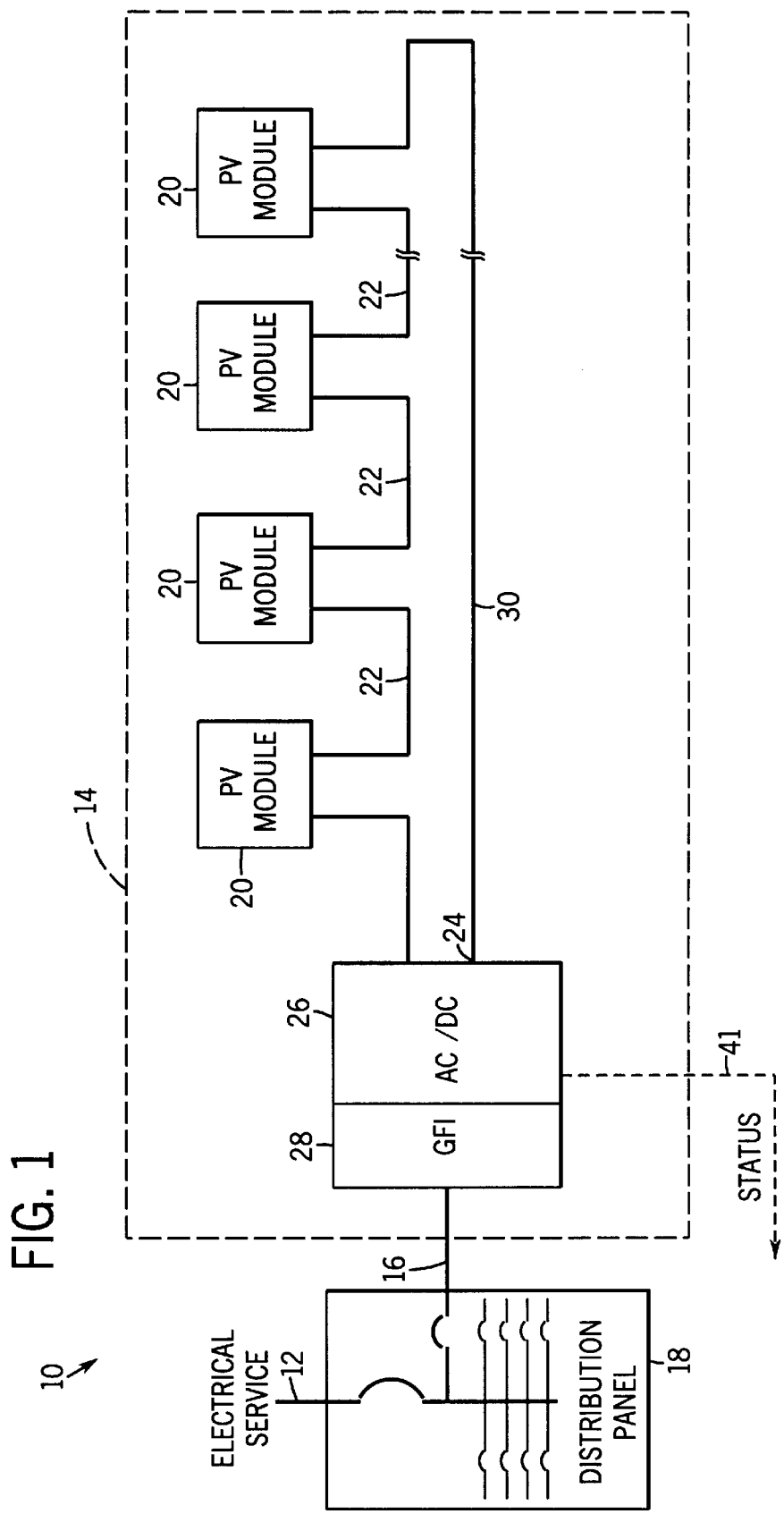
FIG. 1 is a general schematic diagram of a photovoltaic energy system of the present invention including multiple photovoltaic modules and a single power inverter.

FIG. 1 illustrates a supplemental electrical energy supply system 10 that converts solar energy into AC power that can be used to supplement the electrical power provided by an electrical utility provider, as represented by reference numeral 12. The supplemental electrical energy supply system 10 generally includes a photovoltaic energy system 14 that outputs a supply of AC power at an output line 16. The supply of AC power supplied through the output line 16 is coupled to a conventional distribution panel 18 for the electric power in a residential or commercial building. The distribution panel 18 is a conventional component included in most modern buildings to distribute electrical power received from the utility provider 12 to the electrical devices and wiring contained within the building. Typically, the distribution panel 18 includes multiple circuit breakers or fuses that direct the supply of electrical power throughout the building.

The photovoltaic system 14 converts solar energy into a supplemental AC power supply that is coupled directly into a distribution panel 18 by the output line 16. Although the photovoltaic system 14 is described as being a supplemental AC power source, it should be understood that in periods of low electrical usage by the building, the entire electrical supply for the building could be supplied by the photovoltaic system 14 alone, without any electricity being drawn from the utility provider 12. Additionally, if the building is consuming very low amounts of electrical power, the photovoltaic system 14 will actually supply surplus electrical power back to the utility provider 12. In a contemplated alternate embodiment not shown, a plurality of energy storage devices, such as batteries, can be connected to the photovoltaic system 14 to store the surplus electrical power generated during periods of low demand.

In the embodiment of the invention shown in FIG. 1, the photovoltaic system 14 is an environmentally protected unit that includes a plurality of individual photovoltaic modules 20 connected in series by electrical wiring 22. Each of the individual photovoltaic modules 20 absorbs solar energy and converts the solar energy into DC power. The series, or array, of photovoltaic modules 20 are connected such that an aggregate DC power output from the combination of the photovoltaic modules 20 is present at input 24 to a power inverter 26. The power inverter 26 is preferably a DC to AC power inverter, such as the Series 2400 produced by Omnion Power Engineering Corporation, East Troy, Wis., assignees of the present application. The power inverter 26 converts the DC power output from the plurality of photovoltaic modules 20 into an AC power supply. As shown in the preferred embodiment of FIG. 1, the AC power from the power inverter 26 passes through a ground fault interrupt 28 before the AC power is distributed out of the photovoltaic system 14 on the output line 16. The ground fault interrupt 28 can either be internally constructed within the power inverter 26, or can be a separate component coupled to the power inverter 26.

In the embodiment of the invention shown in FIG. 1, each of the photovoltaic modules 20 is hardwired to the adjacent photovoltaic module 20 by the electrical wiring 22. The series of photovoltaic modules 20 are hardwire connected to the power inverter 26 by the main power line 30. Since each of the photovoltaic modules 20 outputs DC power, the electrical wiring 22 between the photovoltaic modules and the main power line 30 carry DC power. In the embodiment of the invention shown in FIG. 1, the entire electrical wiring carrying DC power is environmentally protected within the photovoltaic system 14, such that only AC power leaves the environmentally sealed photovoltaic system 14 at the output line 16.

Figure 2:
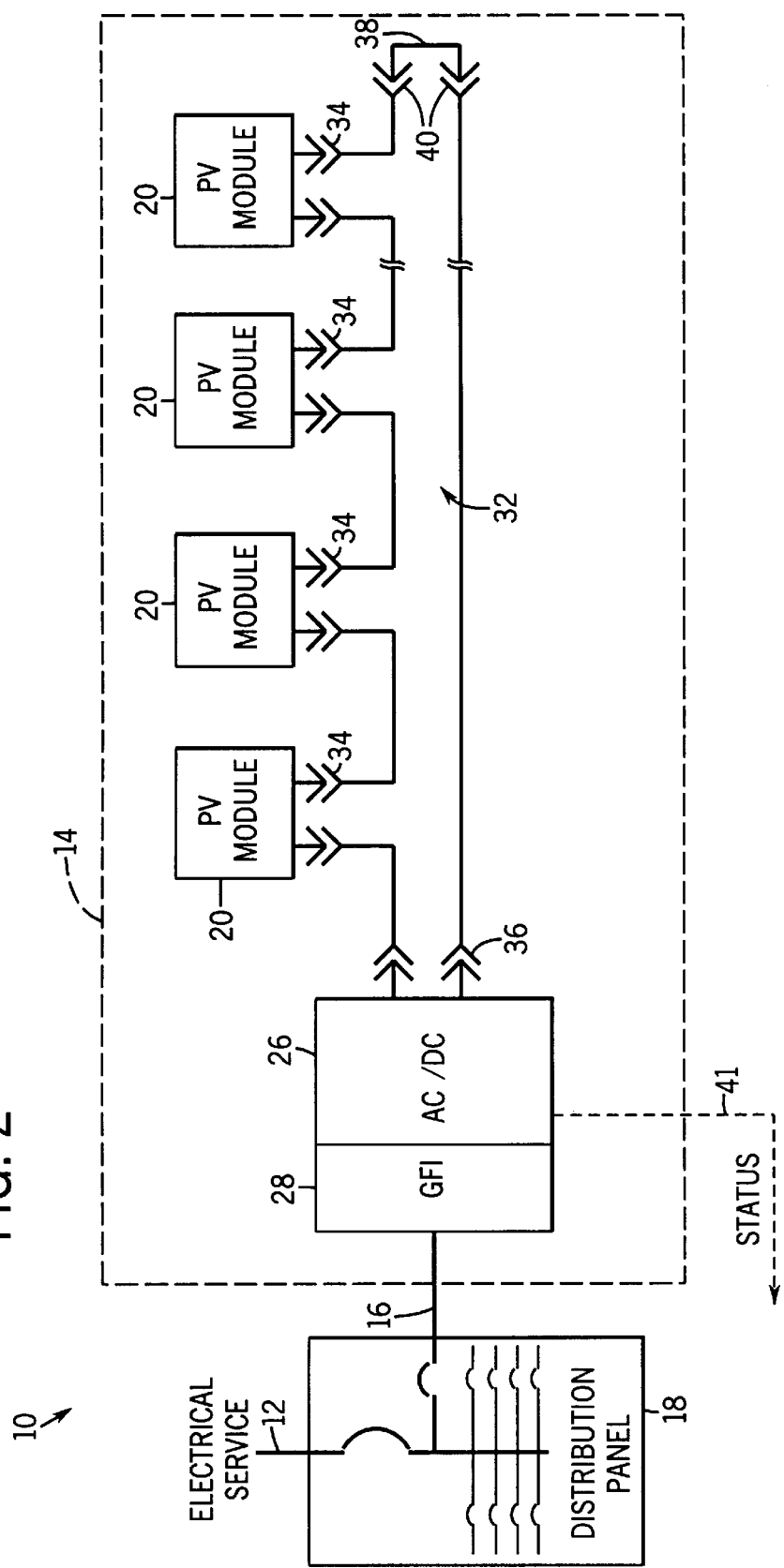
FIG. 2 is an alternate embodiment of the photovoltaic system shown in FIG. 1 including detachable connectors between the individual photovoltaic modules and a busway.

Referring now to FIG. 2, thereshown is an alternate embodiment of the photovoltaic system 14. In the embodiment shown in FIG. 2, each of the photovoltaic modules 20 is connected to a busway 32 by a coupling 34. The couplings 34 allow each of the individual photovoltaic modules 20 to be connected and disconnected from the busway 32. The couplings 34 between the busway 32 and the photovoltaic modules 20 allow the busway 32 to join a user-selected number of photovoltaic modules 20 together within the photovoltaic system 14.

In the embodiment of the invention shown in FIG. 2, each of the photovoltaic modules 20 generates approximately 250 Watts, such that the four modules 20 combine to form a nominal 1 kW photovoltaic system 14. If fewer modules 20 are used, the system 14 would generate less power.

In addition to the couplings 34 between the photovoltaic modules 20 and the busway 32, a coupling 36 is positioned between the busway 32 and the power inverter 26. The coupling 36 allows the busway 32 to be separate from the power inverter 26 and subsequently connected to the power inverter 26 when desired. In the embodiment of the invention shown in FIG. 2, each of the couplings 34 and 36 include a sealing arrangement such that the connections between the photovoltaic modules 20 and the busway 32, as well as the connection between the power inverter 26 and the busway 32, are environmentally sealed to protect the internal electrical wiring carrying DC power within the busway 32. In this manner, the entire photovoltaic system 14 is an environmentally sealed unit that outputs AC power along the output line 16. The busway 32 further includes an end cap 38 connected to the busway by couplings 40 such that the end cap 38 seals the terminal end of the busway 32.

In a contemplated embodiment of the invention, a status line 41 can be coupled to the power inverter 26 to indicate the current status of the AC power being generated by the power inverter 26. The status line 41 can transmit information from the power inverter 26 in many different manners, such as via radio transmission, power line carrier variations in VARs or a dedicated communication link. The status of the power inverter 26 can be sent to a remote location or displayed right at the photovoltaic system 14 such that the operation of the photovoltaic system 14 can be readily monitored.

Figure 3:
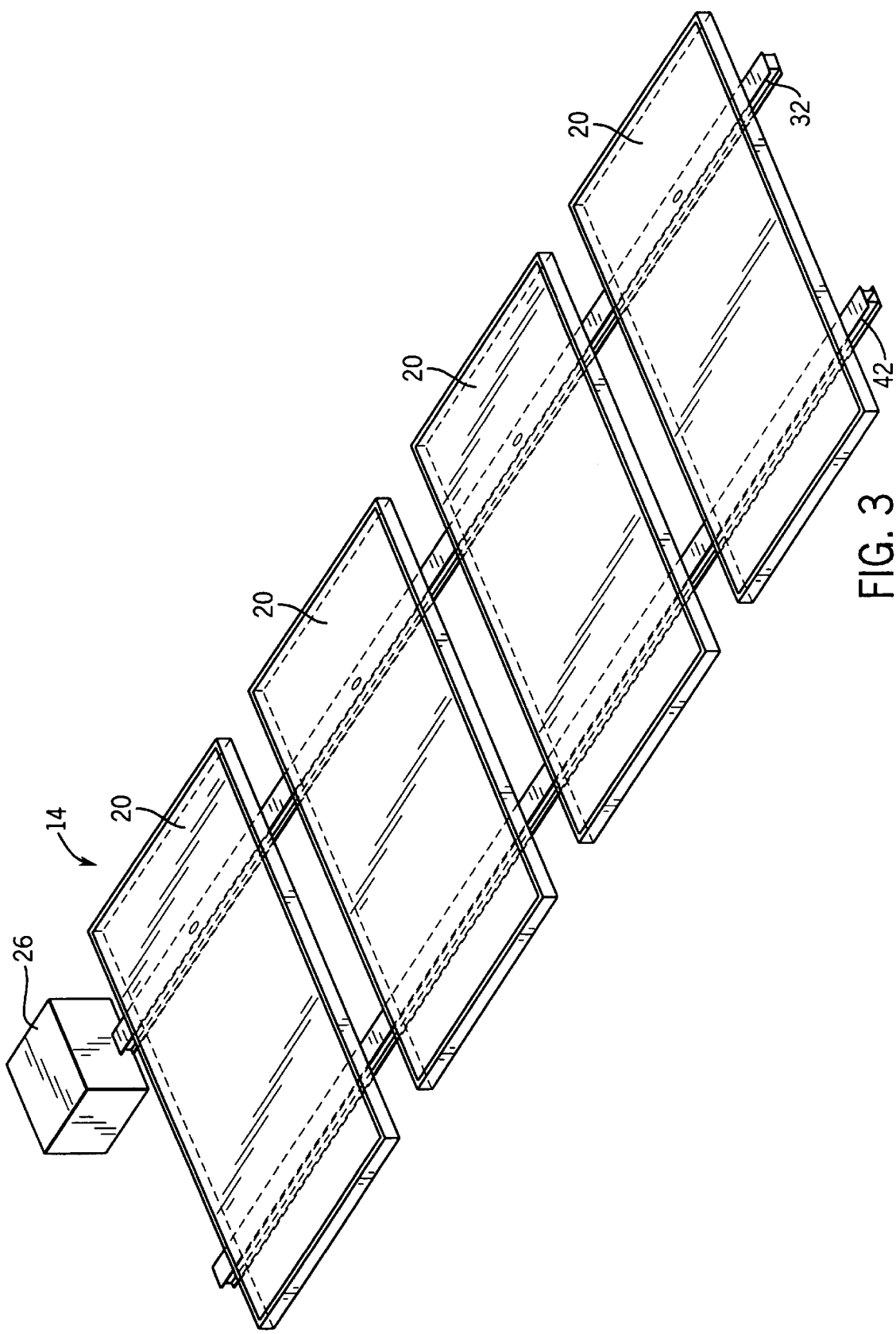
FIG. 3 is a perspective view illustrating a first embodiment of the photovoltaic system of the present invention.

Referring now to FIG. 3, thereshown is a physical embodiment of the photovoltaic system 14 of the present invention. The photovoltaic system 14 includes the photovoltaic modules 20 connected through the busway 32 to the power inverter 26. In the embodiment of the invention shown in FIG. 3, four individual photovoltaic modules 20 are coupled to the busway 32, although additional photovoltaic modules 20 could be added or one or more of the photovoltaic modules 20 shown in FIG. 3 could be removed. In the preferred embodiment of the invention, the power inverter 26 is selected such that it can accommodate varying numbers of photovoltaic modules 20 without being replaced.

Each of the photovoltaic modules 20 is a generally rectangular member that includes a plurality of connected individual photovoltaic cells (not shown) that each convert solar energy into DC power that is output from each individual photovoltaic panel 20. In the embodiment of the invention shown, each module 20 is approximately 2 feet in width by 5 feet in length, although other size modules are contemplated. The photovoltaic modules 20 are supported between the busway 32 and a support member 42. The support member 42 is spaced from the busway 32 and is positioned generally parallel to the busway 32. The spacing between the busway 32 and the support member 42 depends on the length of each photovoltaic module 20, such that the combination of the busway 32 and the support member 42 provide the required support for the plurality of photovoltaic modules 20 on a support surface, such as the roof of a building.

Figure 4:
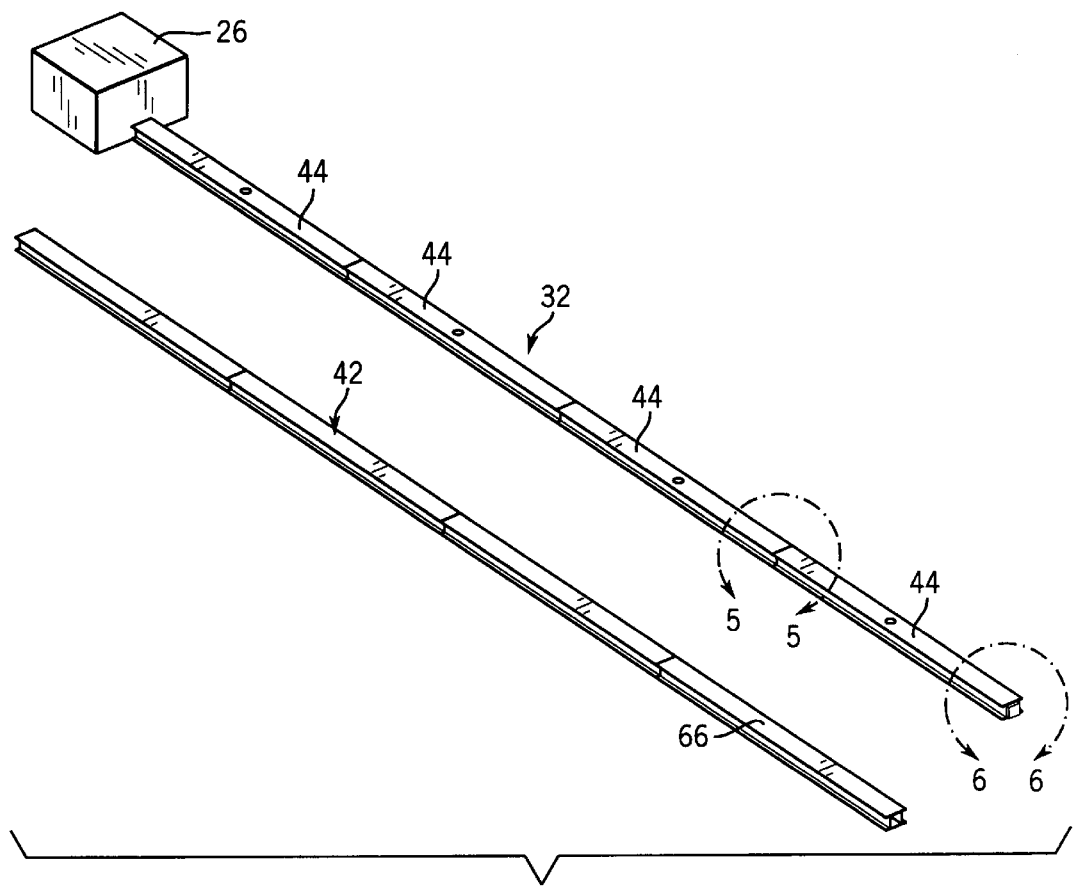
FIG. 4 is a perspective view of a busway, a support member and a power inverter of the first embodiment of the invention.
Figure 5:
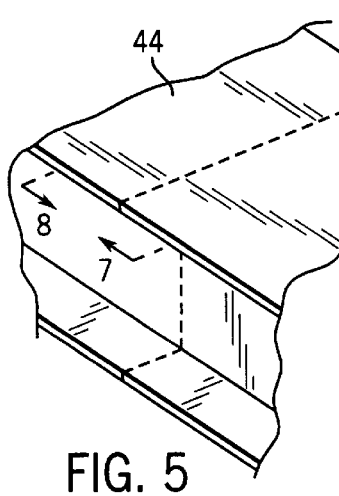
FIG. 5 is an enlarged partial perspective view taken along line 5—5 of FIG. 4 illustrating the interconnection between a pair of busway segments.

Referring now to FIG. 4, the busway 32 of the preferred embodiment is constructed from a plurality of joined individual busway segments 44. The number of busway segments 44 included in the busway 32 can be changed depending upon the number of photovoltaic modules 20 to be included in the photovoltaic system 14. Generally, each of the busway segments 44 is slightly longer than the width of each individual photovoltaic module 20, such that a single busway segment 44 is associated with each photovoltaic module 20 and provides the required spacing between adjacent modules, as shown in FIG. 3.

Figure 6:
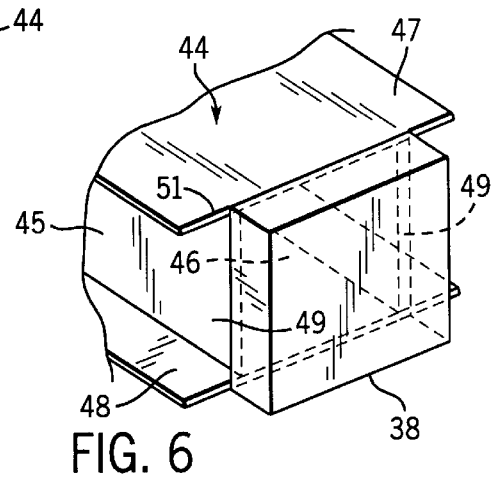
FIG. 6 is an enlarged partial perspective view of the area identified by line 6—6 of FIG. 4 illustrating a sealed end cap included on the terminal end of the busway.

Referring now to FIG. 6, each of the busway segments 44 generally includes an outer shell 45 that defines a hollow, internal wireway 46 that extends through the entire length of the busway segment 44. Specifically, the outer shell 45 of the present invention includes an upper wall 47, a lower wall 48 and a pair of spaced sidewalls 49. The wireway 46 defined by the outer shell 45 extends the entire length of the busway segment 44 and contains the electrical wiring within the busway segment 44. In the preferred embodiment of the invention, the outer shell 45 is formed from an electrically conductive material, such as extruded aluminum. However, it is contemplated by the inventors that alternate materials could be used to form the outer shell 45 while operating within the scope of the present invention. For example, the outer shell 45 could be formed from electrically non-conductive materials such as molded plastic, nylon, PVC or other equivalent materials.

As can be seen in FIG. 6, end cap 38 fits within the terminal end of the busway 32 and seals off the hollow, internal wireway 46 formed within the busway segment 44 to environmentally protect the electrical wiring contained within the wireway 46. The end cap 38 preferably is formed from a resilient, slightly deformable material that engages the inner walls of the busway segment 44 to seal the wireway formed therein.

Figure 7:
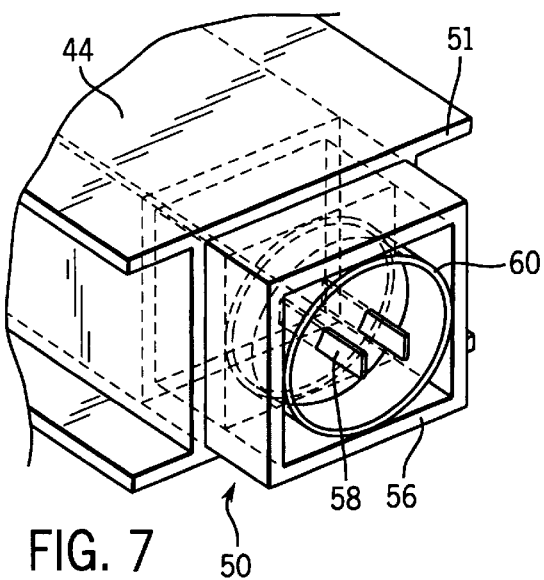
FIG. 7 is an enlarged partial perspective view taken along line 7—7 of FIG. 5 illustrating an end plug included on one end of the busway segment.
Figure 8:
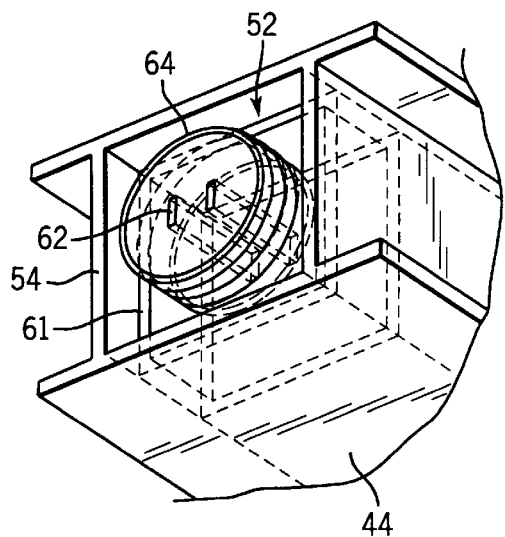
FIG. 8 is an enlarged partial perspective view taken along line 8—8 of FIG. 5 illustrating a mating receptacle formed on an opposite end of the busway segment.

Referring now to FIGS. 7 and 8, each of the busway segments includes an end plug 50 formed on its first end 51 and a mating receptacle 52 formed on its second end 54. Since each of the busway segments 44 includes both an end plug 50 and a mating receptacle 52, each of the busway segments 44 can be coupled to an adjacent busway segment 44 to complete the series electrified connection and create the busway 32 having the desired length.

The end plug 50 formed on the first end 51 of the busway segment 44 includes an outer wall 56 sized to frictionally engage the inner walls of the wireway 46 defined by the outer shell 45 of the busway segment 44. The outer wall 56 surrounds a pair of prongs 58 that are each coupled to the electrical wiring passing through the open wireway 46 within the busway segment 44. The prongs 58 are surrounded by a resilient circular outer sleeve 60.

The second end 54 of each busway segment 44 includes the receptacle 52 having an outer wall 61 that frictionally engages the inner walls of the wireway 46 and is recessed from the second end 54 of the busway segment 44. When adjacent busway segments 44 are joined, the outer wall 56 of the end plug 50 contacts the recessed outer wall 61 of the receptacle 52, while the prongs 58 are received within mating slots 62 formed in the receptacle 52. Each of the slots 62 is surrounded by a circular wall 64 that is received within the circular sleeve 60 surrounding the prongs 58. The circular wall 64 includes increasing diameter segments formed on its outer circumference. The interaction between the increasing outer diameter of the circular wall 64 and the resilient circular outer sleeve 60 environmentally seals the interconnection between the electrical wiring within each of the busway segments 44.

Referring back to FIG. 4, the support member 42 preferably is also formed from individual support segments 66, each of which has a length corresponding to the length of each busway segment 44 such that the same number of support segments 66 and busway segments 44 are required for the mounting of the plurality of photovoltaic modules 20.

Referring now to FIG. 9, each of the individual photovoltaic modules 20 are electrically connected to the electrical wiring contained within the busway segments 44 by a coupling 34 that provides an environmentally sealed junction between the wiring contained within the photovoltaic modules 20 that carries the DC power from the module 20 and the internal wiring contained within the busway segment 44. The coupling 34 allows the photovoltaic panel 20 to be attached to the busway segment 44 and the wiring passing therebetween be environmentally protected.

Figure 10:
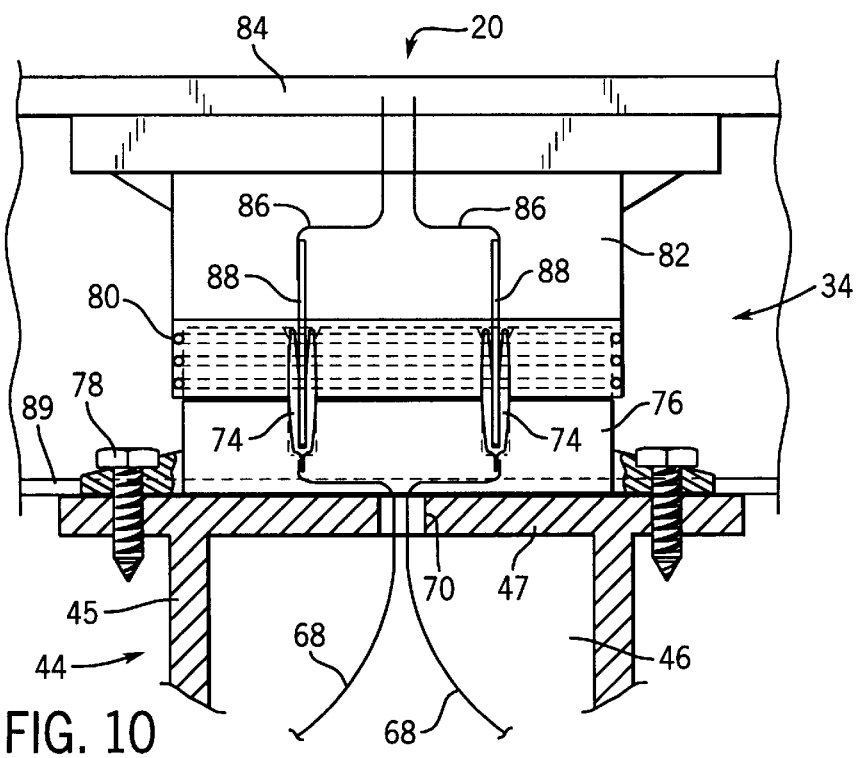
FIG. 10 is an enlarged partial section view taken along line 10—10 of FIG. 9 illustrating the interconnection between a receptacle contained on the busway segment and a plug member formed on the photovoltaic module.

Shown in FIG. 10 is the preferred embodiment of the coupling 34 between the photovoltaic module 20 and the busway segment 44. A pair of electrical wires 68 contained within the wireway 46 defined by the outer shell 45 of the busway segment 44 pass through an opening 70 formed in the upper wall 47 of the busway segment 44. Each of the wires 68 terminate with a pair of spaced metal plates 74 contained within a receptacle 76 attached to the upper wall 47 of the outer shell 45 by a pair of connectors 78. The receptacle 76 is a generally circular member having a plurality of resilient O-rings 80 formed around its outer circumference.

The O-rings 80 surrounding the receptacle 76 engage the internal surface of a mating plug member 82 secured to the bottom wall 84 of the photovoltaic module 20. The interaction between the O-rings 80 contained on the receptacle 76 and the inner wall of the plug member 82 provide an environmentally sealed coupling between the busway segment 44 and the photovoltaic module 20.

Internal wires 86 contained within the photovoltaic module 20 that supply the DC power from the photovoltaic module 20 each terminate in a single metal plate 88. Each of the metal plates 88 are received between a pair of the spaced metal plates 74 on the receptacle 76 to provide the electrical connection between the electrical wires 68 in the busway segment 44 and the electrical wires 86 within the photovoltaic module 20.

As can be understood in FIG. 10, the photovoltaic module 20 can be installed on the busway segment 44 by simply aligning the receptacle 76 on the busway segment 44 with the plug member 82 attached to the top wall 84 of the photovoltaic module 20. Once aligned, the plug member 82 is pushed downward into the receptacle 76 such that the O-rings 80 provide an environmentally sealed enclosure for the electrical wiring extending between the busway segment 44 and the photovoltaic module 20. Since the connections between adjacent busway segments 44 are also environmentally sealed, the entire DC wiring contained in the busway 32 and the plurality of photovoltaic modules 20 is environmentally protected such that no external DC wiring needs to be handled during the installation of the photovoltaic modules 20.

Figure 11:
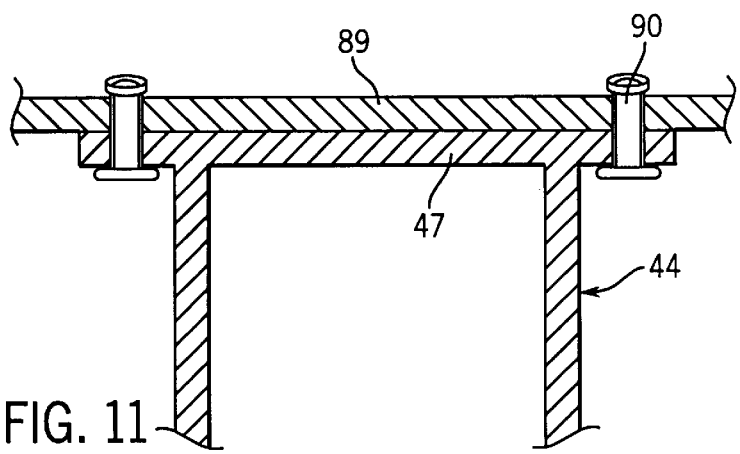
FIG. 11 is a partial section view taken along line 11—11 of FIG. 9.
Figure 12:
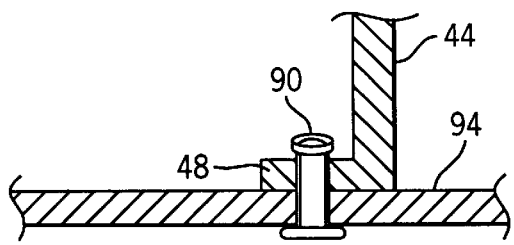
FIG. 12 is a partial section view taken along line 12—12 of FIG. 9.

Referring now to FIG. 11, bottom wall 89 of the photovoltaic module 20 is coupled to the upper wall 47 of the busway segment 44 by a pair of connectors 90. In the preferred embodiment of the invention, the connectors 90 are conventional rivets. In addition, a similar connector 90 is used to secure the bottom wall 48 of the busway segment 44 to a support surface 94, as shown in FIG. 12, such as the roof of a building or other similar structure.

Although not shown in the Figures, the power inverter 26 includes a plug similar to the end plug 50 contained on the first end 51 of the busway segment 44, such that the power inverter 26 can be received in the receptacle 52 contained on the second end 54 of one of the busway segments 44, as shown in FIGS. 7–8. Since the plug 50 contained on the power inverter 26 is received within the receptacle 52 formed on the second end 54 of the busway segment 44, the interconnection between the DC power contained within the busway 32 and the internal components of the power inverter 26 is environmentally sealed and protected. Alternatively, the power inverter 26 could be integrally formed with one of the busway segments 44 and thus completely sealed. As discussed, the power inverter 26 converts the DC power from the plurality of photovoltaic modules 20 into a single AC power output.

Figure 13:
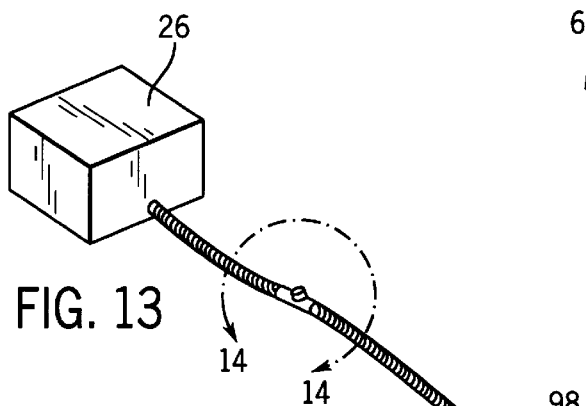
FIG. 13 is a perspective view of an alternate embodiment of the busway and power inverter of the photovoltaic system.
Figure 14:
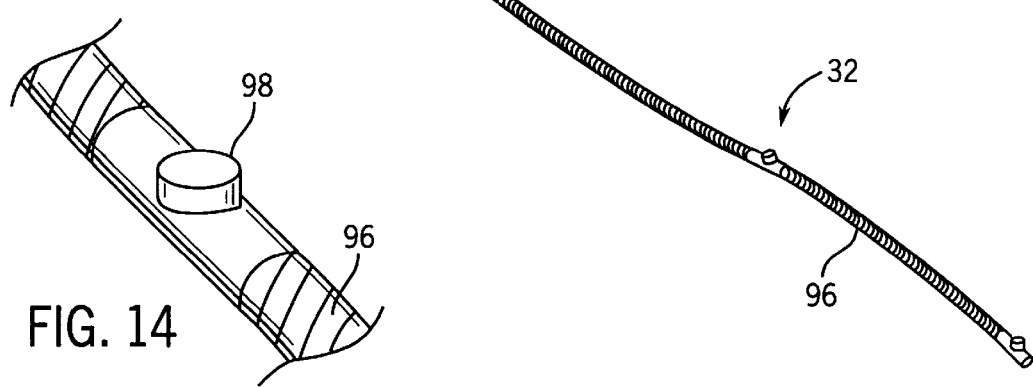
FIG. 14 is an enlarged view taken along line 14—14 of FIG. 13 illustrating an alternate receptacle formed on the busway.

Although the present invention has thus far been defined as including the busway 32 defined by a plurality of busway segments 44, an alternate embodiment of the busway 32 is shown in FIG. 13. In this embodiment, a sealed flexible conduit 96 is connected to the power inverter 26 and includes numerous spaced T-connectors 98 spaced along its length. Each of the T-connectors 98 receives the wires 86 from one of the photovoltaic modules 20 such that the plurality of modules 20 would be connected by the flexible conduit 96. Like the plurality of individual busway segments 44, the flexible conduit 96 environmentally seals and protects the DC wiring passing through the flexible conduit. Additionally, the flexible conduit 96 and the T-connectors 98 provide sealed couplings between the busway 32 and the individual photovoltaic modules 20. In the embodiment shown in FIG. 13, however, the busway 32 does not support the photovoltaic modules 20 but instead would be used in combination with a separate support structure.

Referring now to FIGS. 15–17, thereshown is another embodiment of the busway 32 interconnecting the photovoltaic modules 20. In the embodiment shown in FIGS. 15–17, the busway 32 is formed integrally in one of the edges of the photovoltaic module 20. As can best be seen in FIGS. 16 and 17, the busway 32 is joined to the edge of the photovoltaic module 20 and is defined by an outer wall 100. The outer wall 100 defines a generally hollow open wireway that contains the electrical wiring that carries the DC power from the photovoltaic module 20. Each photovoltaic module 20 includes a first end 102 that includes the end plug 50 having the pair of spaced prongs 58. Second end 104 of each photovoltaic module 20 includes the receptacle 52 having the increasing diameter circular wall 64 surrounding the pair of slots 62.

As previously discussed in the description of the individual busway segments 44 shown in FIGS. 7 and 8, the end plug 50 is received within the receptacle 52 such that the circular wall 64 forms an environmentally protected seal with the circular outer sleeve 60 to protect the DC wiring passing between adjacent modules 20. The primary difference between the embodiment shown in FIGS. 15–17 and the embodiment including the individual busway segment 44 is that the busway 32 in the embodiment shown in FIGS. 15–17 does not provide structural support for the individual photovoltaic modules 20. Instead, the busway 32 is formed integrally with the photovoltaic modules 20 such that the modules can be simply coupled together and the DC wiring passing between adjacent modules is environmentally protected.

Although not shown in the Figures, it is contemplated that the busway 32, shown in FIGS. 3–13 as being formed from a plurality of busway segments 44, could be constructed from a single member having the same or different cross-sectional shape as the busway segments 44. Although a single piece busway 32 is contemplated, transporting such a busway would be more difficult due to the length of the busway, such that multiple joined busway segments 44 are contemplated as being the preferred embodiment.

Figure 18:
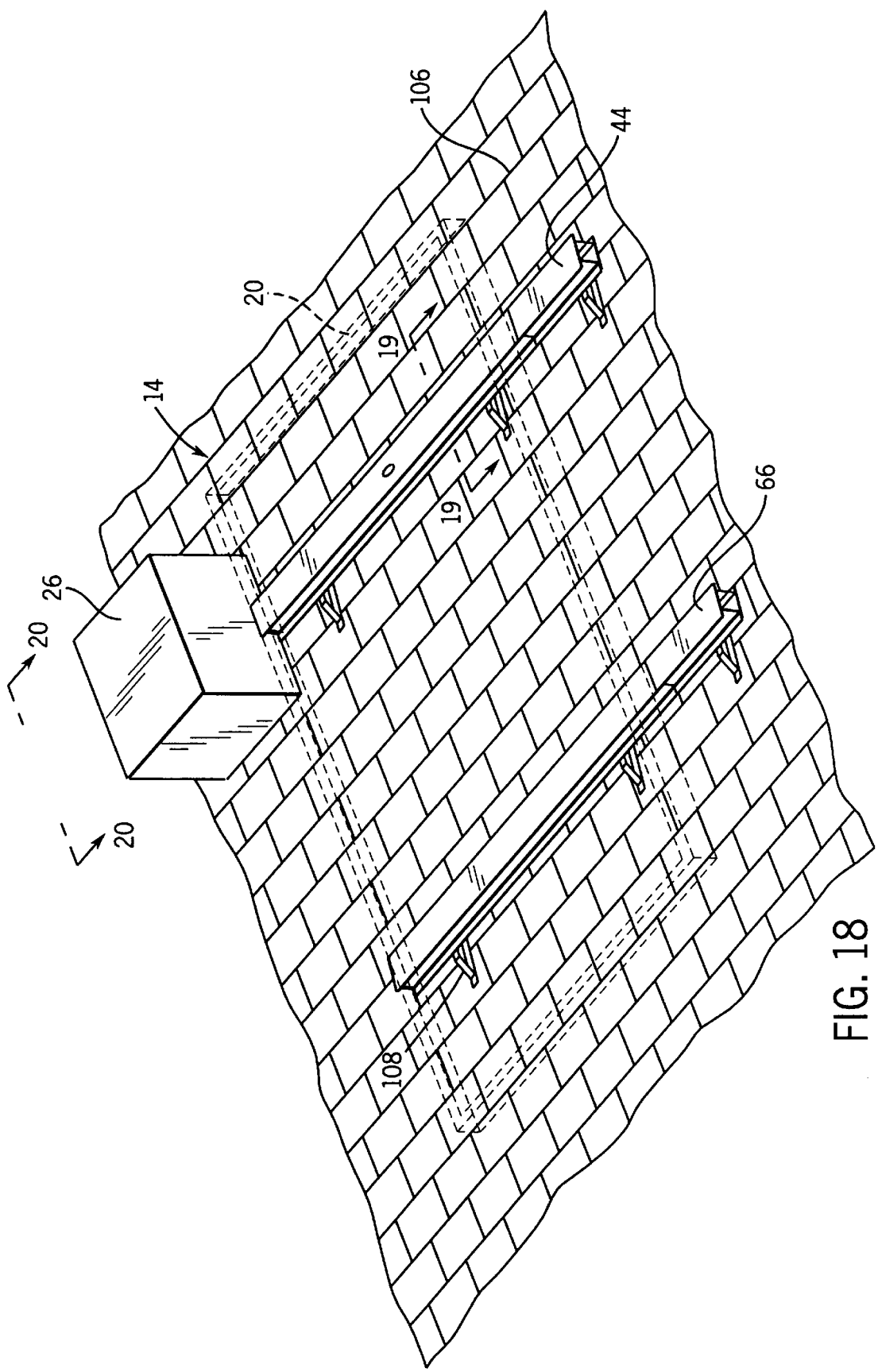
FIG. 18 is a perspective view illustrating the photovoltaic system of the present invention as mounted to a roof surface.
Figure 19:
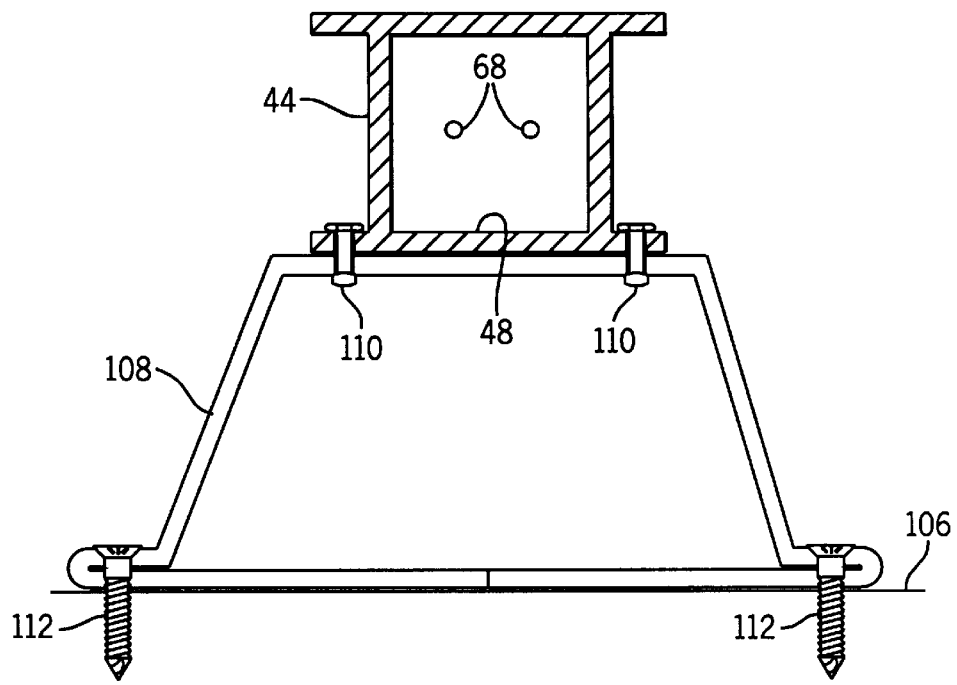
FIG. 19 is a partial section view taken along line 19—19 of FIG. 18 illustrating the mounting of the busway to the roof surface.
Figure 20:
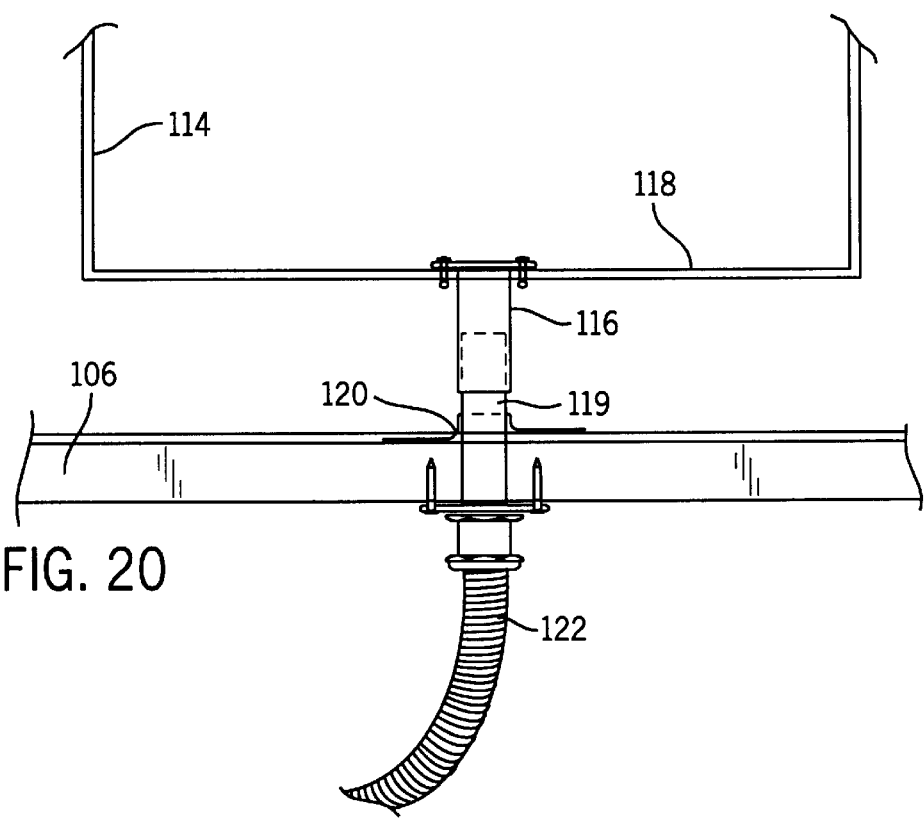
FIG. 20 is a partial section view taken along line 20—20 illustrating the electrical connection passing through the roof of the building to the power inverter.

Referring now to FIGS. 18–20, thereshown is a representation of the photovoltaic system 14 as mounted to a roof 106. As shown in FIG. 18, the power inverter 26 is positioned on the roof 106 and connected to one of the busway segments 44. As shown in FIG. 19, the lower wall 48 of the busway segment 44 is connected to a support member 108 by a pair of connectors 110, such as conventional rivets. Support members 108 space the busway segment 44 above the roof 106 and are each connected to the roof 106 by a pair of screws 112. The support segment 66 also includes a pair of support members 108 that secure the support segment 66 to the roof 106. Once both the busway segment 44 and the support segment 66 are attached to the roof 106, the photovoltaic module 20 can be mounted to the busway segment 44 in the manner previously discussed.

Referring now to FIG. 20, the power inverter 26 includes an outer enclosure 114 that includes a sealed plug-in connector 116 extending from bottom wall 118 of the outer enclosure 114. The plug-in connector receives a mating connector 119 that extends through the roof 106. A flashing 120 surrounds the plug-in connector 119 to seal the opening in the roof. An electrical conduit 122 extends from the plug-in connector 119 to the distribution panel 18 (FIG. 1) contained within the building. The electrical conduit 122 is coupled to the power inverter 26 through the combination of the plug-in connectors 116 and 119. Since the output of the power inverter 26 is AC, the conduit 122 carries only AC power which can be easily handled by licensed electricians.

It is important to understand that a primary feature of the present invention is the environmentally protected connections between the individual photovoltaic modules 20, the busway 32 and the power inverter 26, such that the only exposed electrical wiring in the photovoltaic system 14 is the AC power output at line 16. Additionally, the photovoltaic system 14 of the invention is modular, such that additional busway segments 44 and photovoltaic modules 20 can simply be plugged in to increase the power output of the system 14. When modifying the photovoltaic system 14 in this manner, the DC wiring is completely contained such that special code requests and installation steps that result from exposed DC wiring do not need to be taken. Since only AC power is accessible from the photovoltaic system 14, there is no need to worry or deal with special building code requirements associated with DC wiring, as was the case in previously available photovoltaic systems.

Various alternatives and embodiments are contemplated as being within the scope of the following claims particularly pointing out and distinctly claiming the subject matter regarded as the invention.

What is claimed is:

1. A photovoltaic system for providing a source of AC power, the photovoltaic system comprising:
   a plurality of individual photovoltaic modules for converting solar energy into DC power;
   an enclosed busway coupled to each of the plurality of photovoltaic modules to combine the DC power from each module and provide a DC power output, wherein each photovoltaic module includes a sealed plug member that is received in a mating sealed receptacle formed in the busway to provide an environmentally protected electrical coupling between the photovoltaic modules and the busway; and
   a power inverter connected to the busway for converting the DC power output from the plurality of photovoltaic modules to AC power for output from the photovoltaic system, wherein the busway provides an environmentally protected connection between the electrical wiring and the power inverter.

2. The photovoltaic system of claim 1 wherein the busway includes an outer shell defining an internal wireway sized to contain the electrical wiring interconnecting the plurality of photovoltaic modules and the power inverter, wherein the outer shell environmentally protects the electrical wiring contained within the internal wireway.

3. The photovoltaic system of claim 2 wherein the outer shell is formed from an electrically insulating material.

4. The photovoltaic system of claim 1 wherein the busway is a single, continuous member extending between the plurality of photovoltaic modules.

5. The photovoltaic system of claim 1 wherein the busway includes a plurality of individual busway segments, wherein one of the busway segments is coupled to each photovoltaic module and the plurality of busway segments are joined and environmentally sealed to define the busway.

6. The photovoltaic system of claim 5 wherein the busway segments telescopingly engage the busway segments positioned adjacent thereto.

7. The photovoltaic system of claim 5 wherein each of the busway segments includes an end plug and a receptacle such that the end plugs and receptacles of adjacent busway segments engage each other to form environmentally protected connections between the electrical wiring within the busway segments.

8. The photovoltaic system of claim 1 further comprising a plurality of support members coupled to the busway for attaching the busway and the photovoltaic modules to a support surface.

9. The photovoltaic system of claim 1 further comprising a status transmission member coupled to the power inverter for communicating the status of the power inverter to a location remote from the photovoltaic system.

10. The photovoltaic system of claim 1 further comprising a ground fault detector coupled to the AC power output of the power inverter.

11. The photovoltaic system of claim 1 further comprising a plurality of DC power storage members coupled between the plurality of photovoltaic modules and the power inverter for storing a portion of the DC power output from the plurality of photovoltaic modules prior to conversion to AC power.

12. A photovoltaic system for providing a source of AC power, the photovoltaic system comprising:

a plurality of individual photovoltaic modules for converting solar energy into DC power;

an enclosed busway coupled to each of the plurality of photovoltaic modules to combine the DC power from each photovoltaic module to provide a DC power output, the busway including electrical wiring interconnecting the photovoltaic modules and providing an environmentally protected connection between the electrical wiring and each of the photovoltaic modules; and a power inverter coupled to the busway for converting the DC power output from the plurality of photovoltaic modules to AC power for output from the photovoltaic system, the power inverter including a sealed plug that is received in a mating sealed receptacle formed in the busway, such that the power inverter is removably coupled to the busway and the connection between the power inverter and the busway is environmentally sealed by the interaction between the sealed plug and the sealed receptacle.

13. A photovoltaic system for converting solar energy into a source of AC power, the system comprising:

a plurality of individual photovoltaic modules for converting solar energy into DC power, each photovoltaic module including a sealed plug member;

an environmentally sealed busway having a plurality of sealed receptacles, each sealed receptacle receiving the sealed plug member of one of the photovoltaic modules to couple the plurality of photovoltaic modules to the busway such that the busway combines the DC power from each module and provides a DC power output; and a power inverter directly coupled to the busway for converting the DC power output to AC power for output from the photovoltaic system, wherein the couplings between the busway and the plurality of photovoltaic modules and the coupling between the busway and the power inverter are each environmentally sealed.

14. The photovoltaic system of claim 13 wherein the power inverter includes a sealed plug that is received in a mating sealed receptacle formed in the busway such that the power inverter is removably coupled to the busway and the connection between the power inverter and the busway is environmentally sealed.

15. The photovoltaic system of claim 13 wherein each photovoltaic module includes a frame member that supports a plurality of individual photovoltaic cells, wherein the frame member includes an internal wireway, such that the internal wireways of adjacent photovoltaic modules are joined to define the busway between the individual photovoltaic modules.

16. The photovoltaic system of claim 15 wherein each frame member includes an end plug and a receptacle, such that the end plugs and receptacles of adjacent frame members engage each other to form environmentally protected junctions between the photovoltaic modules.

17. The photovoltaic system of claim 13 wherein the busway includes an outer shell and electrical wiring contained within a wireway defined by the outer shell, wherein the outer shell environmentally protects the electrical wiring contained within the wireway.

18. The photovoltaic system of claim 17 wherein the busway includes a plurality of supports attached to the outer shell of the busway such that the busway and plurality of supports hold the photovoltaic system in place along a support structure.

19. A device for interconnecting a plurality of individual photovoltaic modules and providing a source of AC power, each module having a plug member that supplies DC power from the photovoltaic module, the device comprising:

an enclosed busway including environmentally protected electrical wiring, the busway having a plurality of spaced sealed receptacles that each receive the plug member on one of the photovoltaic modules to connect the photovoltaic module to the electrical wiring within the busway, such that the electrical wiring within the busway combines the DC power from the plurality of photovoltaic modules and provides a DC power output, wherein the connection between the busway and each of the photovoltaic panels is environmentally sealed; and a power inverter coupled to the busway for converting the DC power output to AC power, the coupling between the power inverter and the busway being environmentally sealed such that the DC power is concealed within the device and the device provides a source of AC power.

20. The device of claim 19 wherein the busway includes an outer shell defining an internal wireway sized to contain the electrical wiring that interconnects the plurality of photovoltaic modules and the power inverter, wherein the outer shell environmentally protects the electrical wiring contained within the internal wireway.

21. The device of claim 20 wherein the outer shell is formed from an electrically insulating material.

22. The device of claim 20 wherein the outer shell includes a plurality of support members coupled the outer shell for attaching the busway to a support surface.

23. The device of claim 19 wherein the busway is a single, continuous member extending between the plurality of photovoltaic modules.

24. The device of claim 19 wherein the busway includes a plurality of individual busway segments, wherein each of the busway segments is coupled to one of the photovoltaic modules and the plurality of busway segments are joined and environmentally sealed to define the busway.

25. The device of claim 24 wherein the busway segments telescopingly engage the busway segments positioned adjacent thereto.

26. The device of claim 24 wherein each of the busway segments includes an end plug and a receptacle such that the end plugs and receptacles of adjacent busway segments engage each other to form environmentally protected connections between the electrical wiring within the busway segments.

27. The device of claim 19 wherein the power inverter includes a sealed plug member that is received in a mating sealed receptacle formed in the busway, such that the power inverter is removably coupled to the busway and the connection between the power inverter and the busway is environmentally sealed by the interaction between the sealed plug and the sealed receptacle.

* * * * *